(12) United States Patent
Kohl et al.

(10) Patent No.: US 6,943,965 B2
(45) Date of Patent: Sep. 13, 2005

(54) METHOD FOR CORRECTING OSCILLATION-INDUCED IMAGING ERRORS IN AN OBJECTIVE

(75) Inventors: Alexander Kohl, Aalen (DE); Hubert Holderer, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/351,901

(22) Filed: Jan. 27, 2003

(65) Prior Publication Data

US 2003/0147150 A1 Aug. 7, 2003

(30) Foreign Application Priority Data

Feb. 5, 2002 (DE) .......................................... 102 04 465

(51) Int. Cl.$^7$ ......................... G02B 17/00; G02B 27/64
(52) U.S. Cl. ...................................... 359/727; 359/555
(58) Field of Search ................................ 359/555, 554, 359/557, 727

(56) References Cited

U.S. PATENT DOCUMENTS 5,680,200 A * 10/1997 Sugaya et al. ................ 355/53
5,959,769 A * 9/1999 Yoneyama ................... 359/407
6,191,407 B1 * 2/2001 Cooper ..................... 250/208.1

\* cited by examiner

Primary Examiner—Scott J. Sugarman
(74) Attorney, Agent, or Firm—Welsh & Katz, Ltd.

(57) ABSTRACT

In a method for correcting oscillation-induced imaging errors in an objective, in particular a projection objective in microlithography for fabricating semiconductor elements, an at least first objective part and a second objective part are provided. In this case, the first objective part has a first optical axis and the second objective part has an optical axis which deviates from the first optical axis. Beam deflection takes place between the two objective parts via at least one optical beam deflection element. The oscillations occurring in the second objective part are measured and evaluated by means of a sensor system. The results are used as input data for a device, which adjusts the beam direction in the objective, in such a way that imaging errors occurring as a result of the oscillations of the second objective part are compensated for.

24 Claims, 2 Drawing Sheets

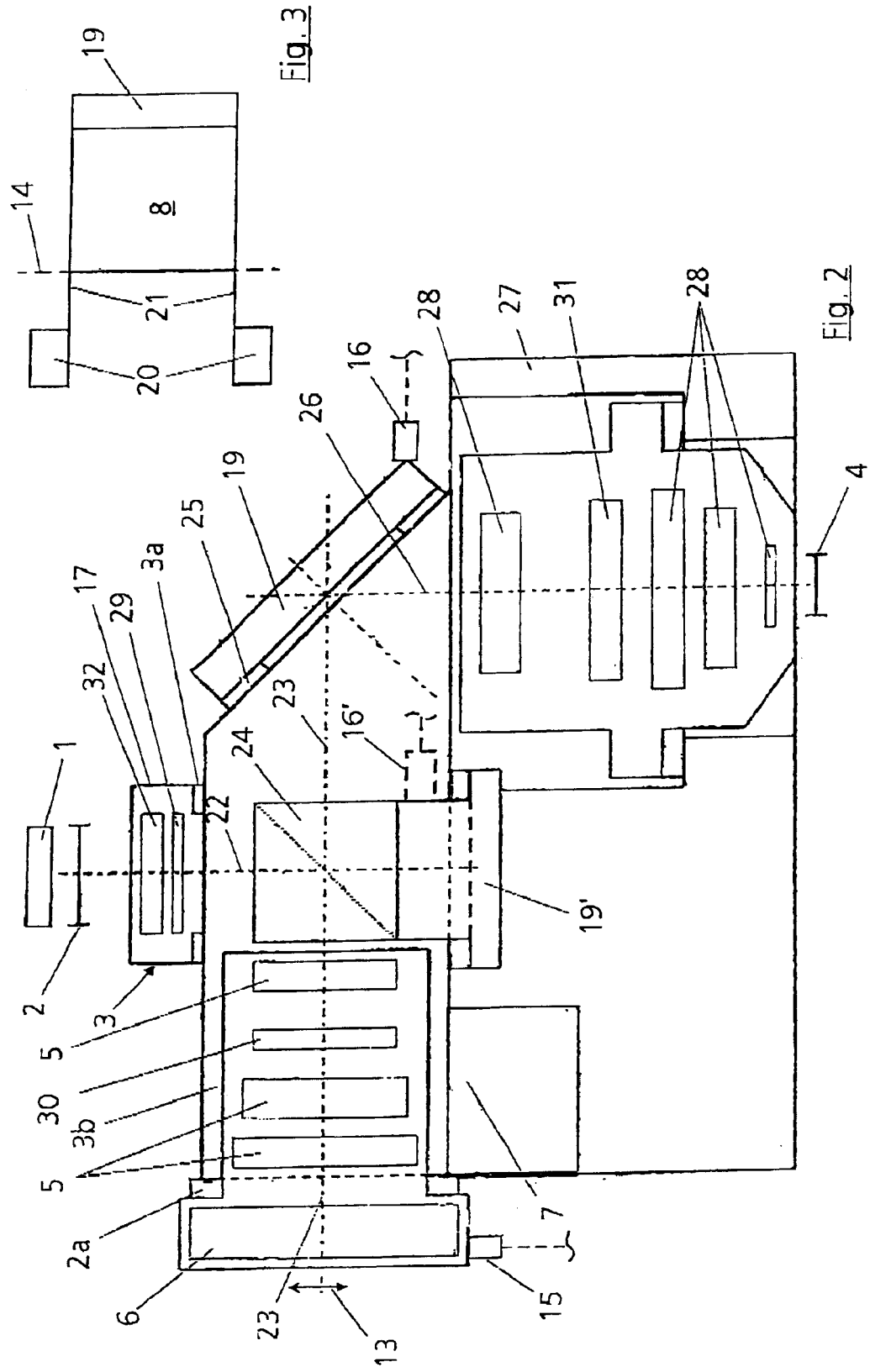

METHOD FOR CORRECTING OSCILLATION-INDUCED IMAGING ERRORS IN AN OBJECTIVE

BACKGROUND OF THE INVENTION

1. Field of the Invention

The invention relates to a method for correcting oscillation-induced imaging errors in an objective, in particular in a projection objective for microlithography for fabricating semiconductor elements, the objective having at least one first objective part with a first optical axis and a second objective part whose optical axis deviates from the first optical axis, beam deflection taking place between the two objective parts via at least one optical beam deflection element.

The invention also relates to an apparatus for correcting oscillation-induced imaging errors in an objective.

Furthermore, the invention relates to a projection objective for microlithography for fabricating semiconductor elements, having at least one first objective part with a first optical axis and having a second objective part whose optical axis deviates from the first optical axis, an optical beam deflection element being arranged between the at least one first objective part and the second objective part.

2. Description of the Related Art

For spatial reasons, objectives, such as e.g. projection objectives for microlithography for fabricating semiconductor elements, are often designed in such a way that a plurality of optical axes are present between an object plane and an image plane. Thus, e.g. so-called catadioptric objectives are known, an objective part having a horizontal optical axis or an optical axis that is inclined slightly downward with respect to the horizontal. In this case, beam deflection takes place on the input side from a first objective part with a vertical optical axis via a prism to a horizontal objective housing. In the horizontal objective part, beam reflection takes place after passage through a group of lenses via a concave mirror back to the prism, from where the beam passes once again with a vertical optical axis to the image plane.

In the case of a similar type of objective, a first vertical optical axis is followed by an optical axis which runs in the horizontal direction and likewise runs in a horizontal objective part. Here, too, the beam is reflected at a concave mirror. In this case, a beam splitter element, e.g. a beam splitter cube, is provided as beam deflection device between the vertical and horizontal axes, the beam reflected at the concave mirror, after passing through the beam splitter element, being deflected at a deflection mirror to a third objective part with a second vertical axis. In this case, the image plane is situated below the third objective part, a wafer being situated in said image plane in the case of a projection objective for microlithography. Arranged in the object plane, which is situated above the first objective part in the case of both types of objective, is a reticle whose structure is imaged on the wafer on a correspondingly reduced scale.

In the case of both types of objective, the second objective part with its objective housing must be made very stiff since dynamic displacements and tiltings of the concave mirror mounted in the horizontal part of the objective housing greatly affect image errors of the objective. What is disadvantageous in this case is, in particular, that in the case of the high imaging accuracies demanded in the case of projection objectives for microlithography, despite a solid mechanical construction, occasionally the imaging qualities demanded cannot be achieved or can only be achieved with a very high outlay.

SUMMARY OF THE INVENTION

Therefore, the present invention is based on the object of providing a method and an apparatus by means of which oscillation-induced imaging errors of an objective part, in particular of an objective part which [lacuna] from the vertical optical axis provided for the image plane, are avoided or at least reduced to a large extent.

According to the invention, this object is achieved in terms of the method by virtue of the fact that oscillations occurring in the second objective part are measured and evaluated by means of a sensor system, and that the results are used as input data for a device, which adjusts the beam direction in the objective, in such a way that imaging errors occurring as a result of the oscillations of the second objective part are compensated for.

In terms of the apparatus, this object is achieved by virtue of the fact that the second objective part is provided with one or more sensors connected to an evaluation and control electronic unit, which is in turn connected to an adjusting element, which alters the position of the beam deflection element in accordance with the input data received.

A solution according to the invention for a projection objective in microlithography for fabricating semiconductor components is described.

The method according to the invention and the apparatus for this enable the influence of unavoidable oscillations of an objective part, in particular of a horizontal objective part, to be regulated or influenced in such a way that the imaging errors occurring as a result of the oscillations are compensated for by a corresponding device. This is possible e.g. by virtue of the fact that the beam deflection part is provided with an adjusting element which, controlled correspondingly by an evaluation and control electronic unit, is activated in such a way that corresponding counter-oscillations are induced, or the adjusting element adjusts the beam deflection element in such a way that the oscillation-induced changes in beam direction are compensated for such that there is no beam deviation on the image plane and thus no reduction of the imaging quality.

In practice, this means e.g. that there are imposed on the beam deflection element oscillations which have an opposite frequency with correspondingly adapted amplitude relative to the oscillations of the objective part which impair the imaging quality. In this way, it is ensured that even in the event of beam deflections, e.g. in the horizontal objective part, the beam which is reflected in the latter always impinges on the same predetermined location in the beam deflection part and can thus be forwarded exactly to the image plane. In practice, the beam deflection element is adjusted continuously in a manner running synchronously with the oscillations.

In a development of the invention, besides an active correction of oscillation-induced imaging errors, the method according to the invention and the apparatus for this can also be used for correcting long-term effects which lead e.g. to a fall or a change in position of optical elements in the objective housing, such as e.g. mirrors, lenses and the beam deflection element, on account of the oscillations that occur. They include e.g. creeping of adhesive bonds and aging of the mounts and the objective structure.

In a similar manner, the method according to the invention can also be used to perform corrections of inhomogeneous temperature distributions in the objective structure.

In both cases, all that is necessary for this is to use a corresponding sensor system to ascertain deviations from a setpoint zero position of the beam deflection device and then to subsequently correct them accordingly.

Advantageous refinements and developments of the invention emerge from the rest of the subclaims and from the exemplary embodiment described in principle below with reference to the drawing.

BRIEF DESCRIPTION OF THE DRAWINGS

FIG. 2 shows a projection exposure installation with an objective in a configuration with two vertical optical axes and a horizontal optical axis in between, and FIG. 3 shows, in plan view, a basic illustration of a prism as beam deflection element with compensation masses.

DETAILED DESCRIPTION

Figure 1:
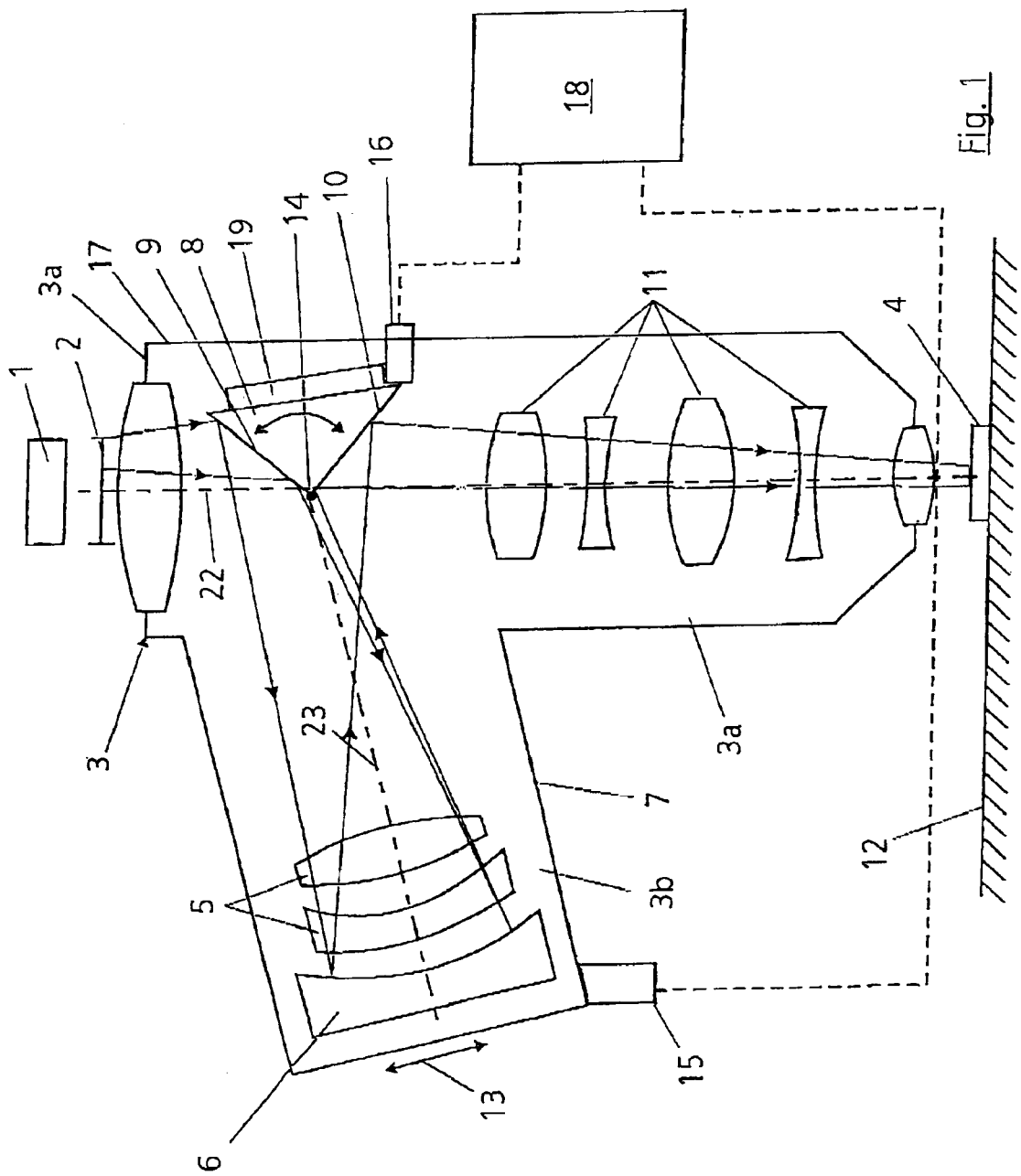
FIG. 1 shows a projection exposure installation with a catadioptric projection objective.

A projection exposure installation for microlithography for fabricating semiconductor elements is described in principle in FIG. 1. It has an illumination system 1 with a laser (not illustrated) as light source. Situated in the object plane of the projection exposure installation is a reticle 2 whose structure is intended to be imaged on a correspondingly reduced scale onto a wafer 4, which is arranged below a projection objective 3 and is situated in the image plane.

In FIG. 1, the projection objective 3 illustrated is a catadioptric objective having a first vertical objective part 3a and a second objective part 3b, which is horizontal or inclined slightly obliquely relative to the horizontal. Situated in the objective part 3b are a plurality of lenses 5 and a concave mirror 6, which are arranged in an objective housing 7 of the objective part 3b. For the deflection of the projection beam (see arrow) from the vertical objective part 3a into the horizontal objective part 3b, a prism 8 is provided as beam deflection element. The projection beams impinging on an upper prism face 9 are reflected at the concave mirror 6 and subsequently impinge on one lower prism face 10, from where the projection beams, after passing through a further group 11 of lenses, impinge on the wafer 4, which is arranged in a displaceable manner on a stationary structure 12 in the projection exposure installation.

Oscillations excited by external influences principally cause the objective housing 7 or the horizontal objective part 3b to oscillate vertically up and down in accordance with arrow direction 13. The image plane in which the wafer 4 is situated shifts as a result. This shift leads to a corresponding lack of sharpness in the imaging. A rotation of the prism 8 about a front prism edge 14 leads to the same result.

The instantaneous positions of the horizontal objective part 3b or objective housing 3 and of the prism 8 are determined by means of position sensors 15 and 16. In this case, the position sensor 15 determines the distance between the horizontal objective housing 7 and the stationary structure 12 and the position sensor 16 determines the distance between the prism 8 and a vertical objective housing 17.

If oscillations of the horizontal objective housing are then ascertained by the position sensor 15, they are input via control lines into an evaluation and control electronic unit 18, where the desired and actual positions are compared with desired and actual positions under the influence of the utilization of the values supplied by the position sensor 16 and an actuator device 19 as a device which adjusts the beam direction in the objective and which is not specifically illustrated in FIG. 1 is driven correspondingly. The actuator device 19 may be of arbitrary design. Thus, electrical, mechanical or else piezoelectric actuator elements are possible for said device. The actuator device 19 pivots the prism 8 about the front prism edge 14 in accordance with the values supplied by the evaluation and control electronic unit 18. For this purpose, the prism 8 is to be arranged in a correspondingly pivotable manner in the objective housing 17. In order that only small adjusting forces are necessary and the adjustment can also be effected very rapidly, the prism 8 can be provided with compensation masses 20 situated at the prism 8 outside the region required for the exposure. As can be seen from the enlarged illustration in FIG. 3, this can be done as follows: at both sides of the prism a rod assembly 21 projects from said prism on that side of the front prism edge which is remote from the actuator device 19 and about which the prism 8 is pivoted, the compensation masses 20 being arranged at the front ends of said rod assembly.

In accordance with the oscillations occurring in the horizontal objective housing 7, counter-oscillations are generated synchronously with said oscillations at the prism 8 through the driving of the evaluation and control electronic unit 18. In this case, the synchronous "counter-oscillations" are to be chosen such that, despite oscillation of the horizontal objective housing 7 in arrow direction 13 and a resultant displacement of the projection beams, the latter always impinge at the same predetermined location on the lower prism face 10.

In addition to the detection of the oscillations of the horizontal objective housing 7 and the subsequent compensation thereof, the concave mirror 6 can also be used for eliminating imaging errors that occur in a different way. For this purpose, one or more reference beams may be introduced into the projection objective 3 outside the normal exposure region and be imaged in an intermediate image plane below the lower prism face 10. Said reference beams can be conducted via a coupling-out mirror (not illustrated) into a detector (likewise not illustrated), where the wavefront is evaluated. Software can then be used to [lacuna], according to these data, a possible desired-actual surface difference for the surface of the concave mirror 6. Afterward, these data can be used as new setting values for the setting of the prism 8 and the resultant possible adjustments thereof. In this way, a corrected zero position of the prism 8 is set in accordance with the imaging errors. This zero position then also serves for the compensation of oscillations in the horizontal objective housing 7.

FIG. 2 shows a similar configuration of a projection objective 3, the same reference symbols having been retained for the same parts. Here, too, provision is made of a first vertical objective part 3a with a vertical optical axis 22, and a second horizontal objective part 3b with an optical axis 23 which runs at least approximately in the horizontal direction. Instead of a prism 8, the beam deflection element provided is a beam splitter element 24 in the form of a beam splitter cube which effects the deflection from the vertical optical axis 22 to the horizontal optical axis 23. After reflection of the beams at the concave mirror 6 and subsequent passage through the beam splitter element 24, said beams impinge on a deflection mirror 25. At the deflection mirror 25, the horizontal beam path 23 is once again deflected into a vertical optical axis 26. Situated below the deflection mirror 25 is a third vertical objective part 27 with a further group 28 of lenses. In addition, three λ/4 plates 29, 30 and 31 are also situated in the beam path. The λ/4 plate 29 is situated in the projection objective between the reticle 2 and the beam splitter element 24 behind a lens or group 32 of lenses. The λ/4 plate 30 is situated in the beam path of the horizontal objective part 3b and the λ/4 plate 31 is situated in the third objective part 27. The three λ/4 plates serve to completely rotate the polarization once, as a result of which, inter alia, beam losses are minimized.

Although the individual optical axes of the projection objective according to FIG. 2 are adjusted very exactly with respect to one another in the construction of the objective, so that they run parallel or perpendicular to one another with sufficient accuracy, the individual objective parts are displaced relative to one another by mechanical oscillations, which leads to a corresponding impairment of the imaging quality. In the same way as in the exemplary embodiment according to FIG. 1, the oscillations occurring in the horizontal objective part 3b are compensated for by an actuator device 19 connected to the deflection mirror 25. Here, too, sensors 15 and 16 again determine the positions of the concave mirror 6 and of the deflection mirror 25, respectively, and conduct the values thereof via control lines to the evaluation and control electronic unit 18, which is no longer illustrated in this exemplary embodiment.

As required, the sensor 15 or else a separate sensor which is arranged at the housing 7 of the objective part 3b can be used to perform corrections which, e.g. on account of long-term effects, have led to a fall e.g. of the concave mirror 6 and would thus likewise lead to imaging errors.

In a similar manner, it is possible to ascertain positional displacements on account of different temperature distributions in the entire objective structure. In both cases, a corresponding correction of the zero position is performed at the prism 8 or the deflection mirror 19.

A wide variety of sensors, such as e.g. capacitive, inductive or other displacement measuring sensors, can be used as sensors 15 and 16.

Instead of the deflection mirror 25 which is acted on by the device 19 which effects adjustment in the beam direction in the objective, the beam splitter element 24 can also be used for this. In this case, the beam splitter element 24 is to be correspondingly provided with a position sensor 16' and an actuator device 19' (see dashed illustration in FIG. 2).

What is claimed is:

1. A method for correcting oscillation-induced imaging errors in an objective, for microlithography, comprising the steps of positioning the objective having at least one first objective part with a first optical axis and at least a second objective part having a second optical axis so that the second optical axis deviates from the first optical axis, placing a beam deflector between the two objective parts so that beam deflection occurs, measuring oscillations occurring in at least one of said objective parts, evaluating said oscillations by means of a sensor system and using the results as input data for a device, said device adjusting the beam direction in the objective, and thereby compensating imaging errors occurring as a result of the oscillations of the oscillating objective part.

2. The method as claimed in claim 1, wherein said oscillating objective part is the second objective part running at least approximately in the horizontal direction or slightly inclined to the horizontal direction.

3. An apparatus for carrying out the method as claimed in claim 1, wherein the oscillating objective part is provided with one or more sensors connected to an evaluation and control electronic unit, which is in turn connected to an adjusting element, which alters the position of the beam deflection element in accordance with the input data received.

4. The apparatus as claimed in claim 3, wherein one or more sensors are provided as a sensor system, which sensors measure oscillations of an objective housing of the oscillating objective part relative to a fixed structure, and wherein at least one sensor is provided at the optical beam deflection element for determining the position thereof.

5. The apparatus as claim 3, wherein one or more sensors are provided at an objective housing of the oscillating objective part, which sensors register positional deviations of the optical axis of the second objective part or of optical elements relative to a starting zero position, the values ascertained being able to be input into an evaluation and control electronic unit for the correction of the zero position.

6. A method for correcting oscillation-induced imaging errors in a projection objective for microlithography for fabricating semiconductor elementscomprising the steps of, providing an objective having at least one first objective part with a first optical axis and at least a second objective part having a second optical axis deviating from the first optical axis, positioning a beam deflector between said first and second objective parts, measuring and evaluating oscillations occurring in at least one of said objective parts by means of a sensor system and using the results of said measuring and evaluating as input data for a deviceto adjust the beam direction in the objectiveand compensating for imaging errors occurring as a result of the oscillating objective part.

7. The method as claimed in claim 6, wherein said optical beam deflection element which effects the beam deflection is a prism, which is inserted between the two objective parts and which is acted on by the device which adjusts the beam direction.

8. A catadioptric projection objective for microlithography for fabricating semiconductor elements, having at least one first objective part with a first vertical optical axis and having a second objective part with a second optical axis, said second optical axis deviating from the first vertical optical axis, and running approximately horizontally or slightly inclined to the horizontal axis, an optical beam deflection element being arranged between the at least one first objective part and the second objective part, wherein the second objective part has one or more sensors connected to an evaluation and control electronic unit, which is in turn connected to an adjusting element, for altering the position of the beam deflection element in accordance with an input data received and a deflection mirror, a beam splitter element or prism which is acted on by the adjusting element for beam deflection between the first objective part and the second objective part.

9. The projection objective as claimed in claim 8, wherein a third objective part with a second vertical optical axis is provided in addition to said first objective part with the first vertical optical axis, a beam splitter element being arranged between said first objective part and said second objective part, which has at least approximately an optical axis running in the horizontal direction or slightly inclined to the horizontal axis, and wherein a deflection mirror which is acted on by said adjusting element is arranged as beam deflection element between said second objective part and the said objective part.

10. A method for correcting oscillation-induced imaging errors in a catadioptric projection objective for microlithography for fabricating semiconductor elements, the objective having at least one first objective part with a first optical axis and at least a second objective part whose optical axis deviates from said first optical axis, a beam deflection taking place between the first and second objective parts via at least one optical beam deflection element, wherein oscillations occurring in at least one of said first and second objective parts are measured and evaluated by means of a sensor system and wherein the results are used as input data for a device, which adjusts the beam direction in the objective, in such a way that imaging errors occurring as a result of the oscillations of the oscillating objective part are compensated for, wherein the optical axis of the second objective running at least approximately in the horizontal direction or slightly inclined to the horizontal direction.

11. The method as claimed in claim 10, wherein, in addition to the at least first objective part with a vertical optical axis, a third objective part with a vertical optical axis is used, and wherein said second objective part arranged between the first and third objective parts.

12. The method as claimed in claim 11, wherein a beam splitter element is used for beam deflection between said first and second objective parts.

13. The method as claimed in claim 12, wherein the device which adjusts the beam direction acts on the beam splitter element.

14. The method as claimed in claim 12, wherein a deflection mirror is used as the optical beam deflection element which effects the beam deflection, which deflection mirror is arranged between said second objective part and said third objective part and is acted on by the device which adjusts the beam direction.

15. The method as claimed in claim 10, wherein said device which adjusts the beam direction in the objective is used to compensate for imaging errors based on long-term effects, for which purpose a zero position is adjusted in a manner dependent on the long-term effects.

16. The method as claimed in claim 10, wherein said device which adjusts the beam direction in the objective is used to compensate for inhomogeneous temperature distributions in the objective structure, for which purpose a zero position is adjusted in a manner dependent on the inhomogeneous temperature distribution.

17. An apparatus for carrying out the method as claimed in claim 10, wherein said second objective part is provided with one or more sensors connected to an evaluation and control electronic unit, which is in turn connected to an adjusting element, which alters the position of the beam deflection element in accordance with the input data received.

18. The apparatus as claimed in claim 17, wherein said adjusting element acts on the beam deflection element.

19. The apparatus as claimed in claim 17, wherein said beam deflection element being designed as a deflection mirror, beam splitter element or prism which is acted on by the adjusting element.

20. The apparatus as claimed in claim 17, wherein a third objective part with a second vertical optical axis is provided in addition to said first objective part with the first vertical optical axis, and wherein a beam splitter element is provided for the beam deflection between said first objective part and said second objective part, and wherein the beam deflector element is a deflection mirror arranged between said second objective part and said third objective part.

21. The apparatus as claimed in claim 17, wherein one or more sensors are provided as a sensor system, which sensors measure oscillations of an objective housing of the second objective part relative to a fixed structure, and wherein at least one sensor is provided at the optical beam deflection element for determining the position thereof.

22. The apparatus as claimed in claim 17, wherein one or more sensors are provided at an objective housing of the second objective part, said sensors registering positional deviations of the optical axis of the second objective part or of optical elements relative to a starting zero position, the values ascertained being able to be input into an evaluation and control electronic unit for the correction of the zero position.

23. The apparatus as claimed in claim 17, wherein said beam deflection element is provided with a compensation mass, which at least approximately compensates for the weight of said element.

24. The apparatus as claimed in claim 23, wherein, beam deflection element is a prism with an axis of rotation at a front edge thereof and, the compensation mass is situated on a side of the axis of rotation remote from said adjusting element.

* * * * *

UNITED STATES PATENT AND TRADEMARK OFFICE
CERTIFICATE OF CORRECTION

PATENT NO. : 6,943,965 B2
APPLICATION NO. : 10/351901
DATED : September 13, 2005
INVENTOR(S) : Alexander Kohl et al.

Page 1 of 1

It is certified that error appears in the above-identified patent and that said Letters Patent is hereby corrected as shown below:

Column 6, line 24:
instead of".... for a deviceto adjust...."
it should be ".... for a device to adjust...."

Column 6, line 25:
instead of ".... in the objectiveand compensating for...."
it should be ".... in the objective and compensating for...."

Signed and Sealed this

First Day of August, 2006

JON W. DUDAS
*Director of the United States Patent and Trademark Office*